(12) United States Patent
Watanabe et al.

(10) Patent No.: US 11,417,494 B2
(45) Date of Patent: Aug. 16, 2022

(54) INCIDENT AXIS ALIGNMENT METHOD FOR ELECTRON GUN EQUIPPED WITH PHOTOCATHODE, COMPUTER PROGRAM, AND ELECTRON GUN EQUIPPED WITH PHOTOCATHODE

(71) Applicant: Photo electron Soul Inc., Nagoya (JP)

(72) Inventors: Reiki Watanabe, Nagoya (JP);
Tomohiro Nishitani, Nagoya (JP);
Atsushi Koizumi, Nagoya (JP);
Haruka Shikano, Nagoya (JP)

(73) Assignee: Photo electron Soul Inc., Nagoya (JP)

( * ) Notice: Subject to any disclaimer, the term of this patent is extended or adjusted under 35 U.S.C. 154(b) by 0 days.

(21) Appl. No.: 17/055,984

(22) PCT Filed: May 14, 2019

(86) PCT No.: PCT/JP2019/019124
§ 371 (c)(1),
(2) Date: Nov. 16, 2020

(87) PCT Pub. No.: WO2019/221119
PCT Pub. Date: Nov. 21, 2019

(65) Prior Publication Data
US 2021/0375578 A1 Dec. 2, 2021

(30) Foreign Application Priority Data

May 17, 2018 (JP) .............................. JP2018-095418

(51) Int. Cl.
*H01J 37/147* (2006.01)
*H01J 37/073* (2006.01)
(Continued)

(52) U.S. Cl.
CPC ............ *H01J 37/1471* (2013.01); *H01J 1/34* (2013.01); *H01J 3/021* (2013.01); *H01J 37/073* (2013.01);
(Continued)

(58) Field of Classification Search
CPC ........ H01J 37/1471; H01J 37/073; H01J 1/34; H01J 3/021
See application file for complete search history.

(56) References Cited

U.S. PATENT DOCUMENTS 9,934,926 B2   4/2018   Nishitani

FOREIGN PATENT DOCUMENTS

JP   A 2001-143648 A   5/2001
JP   3537779 B2   3/2004
(Continued)

OTHER PUBLICATIONS

European Extended European Search Report, dated Jul. 6, 2021 for corresponding European application No. 19802641.1 (total 9 pages).
(Continued)

*Primary Examiner* — Joseph L Williams
(74) *Attorney, Agent, or Firm* — Intellectual Property Law Group LLP

(57) ABSTRACT

The present invention addresses the problem of providing a method for automatically adjusting an electron beam emitted from an electron gun equipped with a photocathode to the incident axis of an electron optical system.
[Solution] An incident axis alignment method for an electron gun equipped with a photocathode,
the electron gun being capable of emitting an electron beam in a first state due to the photocathode being irradiated with excitation light, and
the method including at least
an excitation light radiation step,
(Continued)

a first excitation light irradiation position adjustment step for changing the irradiation position of the excitation light on the photocathode and adjusting the irradiation position of the excitation light, and an electron beam center detection step for detecting whether a center line of the electron beam in the first state coincides with an incident axis of an electron optical system.

20 Claims, 12 Drawing Sheets

(51) Int. Cl.
    *H01J 3/02*         (2006.01)
    *H01J 1/34*         (2006.01)

(52) U.S. Cl.
    CPC ............... *H01J 2237/06333* (2013.01); *H01J 2237/1501* (2013.01)

(56) References Cited

FOREIGN PATENT DOCUMENTS

| | | |
|---|---|---|
| JP | 2009/31634 A | 2/2009 |
| JP | 2010-125467 A | 6/2010 |
| JP | 2010/182466 A | 8/2010 |
| JP | 5394763 B2 | 1/2014 |
| WO | WO 2015/008561 A1 | 1/2015 |
| WO | WO 2015/082295 A1 | 6/2015 |

OTHER PUBLICATIONS

International Search Report, dated Aug. 13, 2019 for corresponding International Application No. PCT/JP2019/019124 with English translation.

Written Opinion of the ISA, dated Aug. 13, 2019 for corresponding International Application No. PCT/JP2019/019124 with English translation.

US 11,417,494 B2

INCIDENT AXIS ALIGNMENT METHOD FOR ELECTRON GUN EQUIPPED WITH PHOTOCATHODE, COMPUTER PROGRAM, AND ELECTRON GUN EQUIPPED WITH PHOTOCATHODE

CROSS-REFERENCE TO RELATED APPLICATIONS

This application is a U.S. National Phase application, under 35 U.S.C. § 371, of International Application no. PCT/JP2019/019124, with an international filing date of May 14, 2019, and claims priority to Japanese application no. 2018-095418, filed on May 17, 2018, each of which is hereby incorporated by reference for all purposes.

TECHNICAL FIELD

The present invention relates to an incident axis alignment method for an electron gun equipped with a photocathode, a computer program, and an electron gun equipped with a photocathode. In particular, the present invention relates to a method for automatically adjusting an electron beam emitted from an electron gun equipped with a photocathode to the incident axis of an electron optical system, a computer program for implementing the method, and an electron gun provided with a computer that includes a memory in which the program is stored.

TECHNICAL BACKGROUND

Devices such as electron guns equipped with photocathodes, electron microscopes that include these electron guns, free electron laser accelerators, and inspection devices are known (below, devices that include electron guns are also referred to simply as "devices") (see Patent Document 1).

In devices provided with electron guns, it is necessary to obtain bright images and high resolution. Therefore, when an electron gun is first mounted to a device or when the electron gun is replaced, it is necessary to carry out work for adjusting the incident axis of an electron beam so that an electron beam emitted from the electron gun will align with the optical axis of an electron optical system of the device. Even during normal operation, the incident axis of the electron beam is adjusted as needed in order to adjust discrepancies between the incident axis of the electron beam and the optical axis of the electron optical system of the device caused by changes over time, etc. (below, adjustment of the incident axis of the electron beam is also referred to as "alignment").

Alignment often involves manually manipulating an electron gun after the electron gun is mounted on a device, but in recent years there has been an increase in the number of studies into adopting an automated approach. As a related technique there is known a method in which a motor is driven, the electron gun is mechanically scanned, the axis along which an electron beam enters an opening in an annular anode electrode A2 is adjusted, and an optimal mechanical position of the electron gun when the amount of current flowing through the opening in the anode electrode A2 is greatest is acquired automatically, whereby the axis along which the electron beam enters the anode electrode A2 is automatically optimized (see Patent Document 2).

Moreover, as another related technique there is known a method in which there are provided: an electron gun that emits an electron beam; a condensing coil that condenses the electron beam; and alignment control means having alignment means for causing the electron beam to be incident on the center of the condensing coil, a digital observation optical system that observes a irradiation image of the electron beam, an image processing unit that processes image data from the digital observation optical system, and a control unit that controls the electron gun, the condensing coil, and the alignment means on the basis of processed data from the image processing unit. In the aforedescribed method, the control unit of the alignment control means controls the electron gun and the condensing coil, irradiates a target with the electron beam in a state having a prescribed difference in focusing, and outputs an alignment control signal to the alignment means on the basis of a correction value calculated from the difference between positional coordinates of the irradiation image (see Patent Document 3).

PRIOR ART LIST

Patent Documents

Patent Document 1: International Publication No. 2015/008561
Patent Document 2: Japanese Patent No. 5394763
Patent Document 3: Japanese Laid-open Patent Application No. 2010-125467

SUMMARY OF THE INVENTION

Problems to be Solved by the Invention

Thermionic-emission electron guns, field-emission (FE) electron guns, and Schottky electron guns are known. Among these, thermionic-emission electron guns are exceptional in terms of probe current amount, current stability, and cost, and are often used in generic SEMs, EPMAs, Auger analysis devices, etc. Therefore, as indicated in Patent Documents 2 and 3, research into automation of alignment often involves thermionic-emission electron guns.

The electron gun equipped with a photocathode that is disclosed in Patent Document 1 can emit a bright, sharp electron beam due to the photocathode being irradiated with excitation light. Accordingly, progress has been made in recent years with regard to technological developments. However, electron guns equipped with photocathodes are still in the process of being developed, and no alignment in which the characteristics of the photocathodes are used is known.

As a result of thorough research, the inventors newly discovered that: (1) in an electron gun equipped with a photocathode, unlike with conventional electron guns, it is possible to readily adjust the position of an electron beam emitted from the photocathode by changing the position of excitation light with which the photocathode is irradiated; and (2) therefore, implementing an excitation light irradiation position adjustment step for changing the position of excitation light with which the photocathode is irradiated during alignment makes it possible to easily implement alignment without changing the position of the electron gun mounted on a device.

Accordingly, an object of the disclosure in the present application is to provide a method for causing an electron beam emitted from an electron gun equipped with a photocathode to automatically align with the incident axis of an electron optical system, a computer program for implementing the method, and an electron gun provided with a computer that includes a memory in which the program is stored. Other arbitrary additional effects of the disclosure in the present application are clarified in the description of the embodiments.

Means to Solve the Problems

The present application relates to the incident axis alignment method for an electron gun equipped with a photocathode, the computer program, and the electron gun equipped with a photocathode that are indicated below.
(1) An incident axis alignment method for an electron gun equipped with a photocathode,
the electron gun being capable of emitting an electron beam in a first state due to the photocathode being irradiated with excitation light, and
the method comprising at least
an excitation light radiation step,
a first excitation light irradiation position adjustment step for changing the irradiation position of the excitation light on the photocathode and adjusting the irradiation position of the excitation light, and
an electron beam center detection step for detecting whether a center line of the electron beam in the first state coincides with an incident axis of an electron optical system.
(2) The incident axis alignment method according to (1) above, wherein:
the method furthermore comprises
a first electron beam emitting direction deflection step for deflecting the emitting direction of the electron beam in the first state at a position set apart from the photocathode; and
the first electron beam emitting direction deflection step advances in cases where it is assessed, in the electron beam center detection step, that the center line of the electron beam in the first state does not coincide with the incident axis of the electron optical system.
(3) The incident axis alignment method according to (1) or (2), wherein:
the method furthermore comprises
an electron beam arrival detection step for detecting whether the electron beam, having passed through an aperture of the electron optical system, has arrived at a detector,
an electron beam irradiation region expansion step for expanding an irradiation region irradiated with the electron beam emitted due to the photocathode being irradiated with the excitation light to a greater extent than an irradiation region of the electron beam in the first state,
a second excitation light irradiation position adjustment step for changing the irradiation position of the excitation light and adjusting the irradiation position of the excitation light, and
an electron beam irradiation region reversion step for restoring the electron beam that has been expanded through the electron beam irradiation region expansion step to the first state;
the electron beam arrival detection step is provided immediately after the excitation light radiation step;
in cases where arrival of the electron beam is detected in the electron beam arrival detection step, a process advances to the first excitation light irradiation position adjustment step;
in cases where arrival of the electron beam has not been detected in the electron beam arrival detection step, the process advances to the electron beam irradiation region expansion step; and the second excitation light irradiation position adjustment step is provided between the electron beam irradiation region expansion step and the electron beam irradiation region reversion step.
(4) The incident axis alignment method according to (3) above, wherein,
immediately before or immediately after the second excitation light irradiation position adjustment step,
the method comprises a second electron beam emitting direction deflection step for deflecting the emitting direction of the electron beam expanded through the electron beam irradiation region expansion step at a position set apart from the photocathode.
(5) The incident axis alignment method according to (3) or (4) above, wherein
the electron beam irradiation region expansion step and the electron beam irradiation region reversion step are carried out by changing the irradiation region of the excitation light using an excitation light irradiation region adjustment device.
(6) The incident axis alignment method according to (3) or (4), wherein
the electron beam irradiation region expansion step is carried out by continuously changing the irradiation position of the excitation light using an excitation light radiation direction control device, and
the electron beam irradiation region reversion step is carried out by not changing the irradiation position of the excitation light using the excitation light radiation direction control device.
(7) The incident axis alignment method according to (3) or (4) above, wherein
the electron beam irradiation region expansion step and the electron beam irradiation region reversion step are carried out by changing an acceleration voltage applied to the emitted electron beam.
(8) The incident axis alignment method according to any one of (1) to (7) above, wherein
the first excitation light irradiation position adjustment step is carried out using an excitation light radiation direction control device.
(9) The incident axis alignment method according to any one of (3) to (8) above, wherein
the second excitation light irradiation position adjustment step is carried out using an excitation light radiation direction control device.
(10) The incident axis alignment method according to any one of (3) to (9) above, wherein,
after the electron beam irradiation region reversion step, the process advances to the electron beam arrival detection step.
(11) A computer program that causes a computer including a processor and a memory under the control of the processor
to execute the steps described in any one of (1) to (10) above.
(12) An electron gun equipped with a photocathode,
the electron gun being provided with at least a computer including a processor and a memory under the control of the processor, and
the memory having stored therein a computer program for causing the computer to execute the steps described in any one of (1) to (10) above.

Advantageous Effects of the Invention

According to the disclosure in the present application, it is possible to automate the alignment of the incident axis of an electron gun equipped with a photocathode.

DESCRIPTION OF THE EMBODIMENTS

Below is a detailed description, made with reference to the drawings, of an incident axis alignment method for an electron gun equipped with a photocathode, a computer program, and an electron gun equipped with a photocathode. In the present specification, members having the same function are designated by the same or similar symbols. In some instances, members designated by the same or similar symbols are described no more than once.

(Embodiment of Electron Gun)

Figure 1:
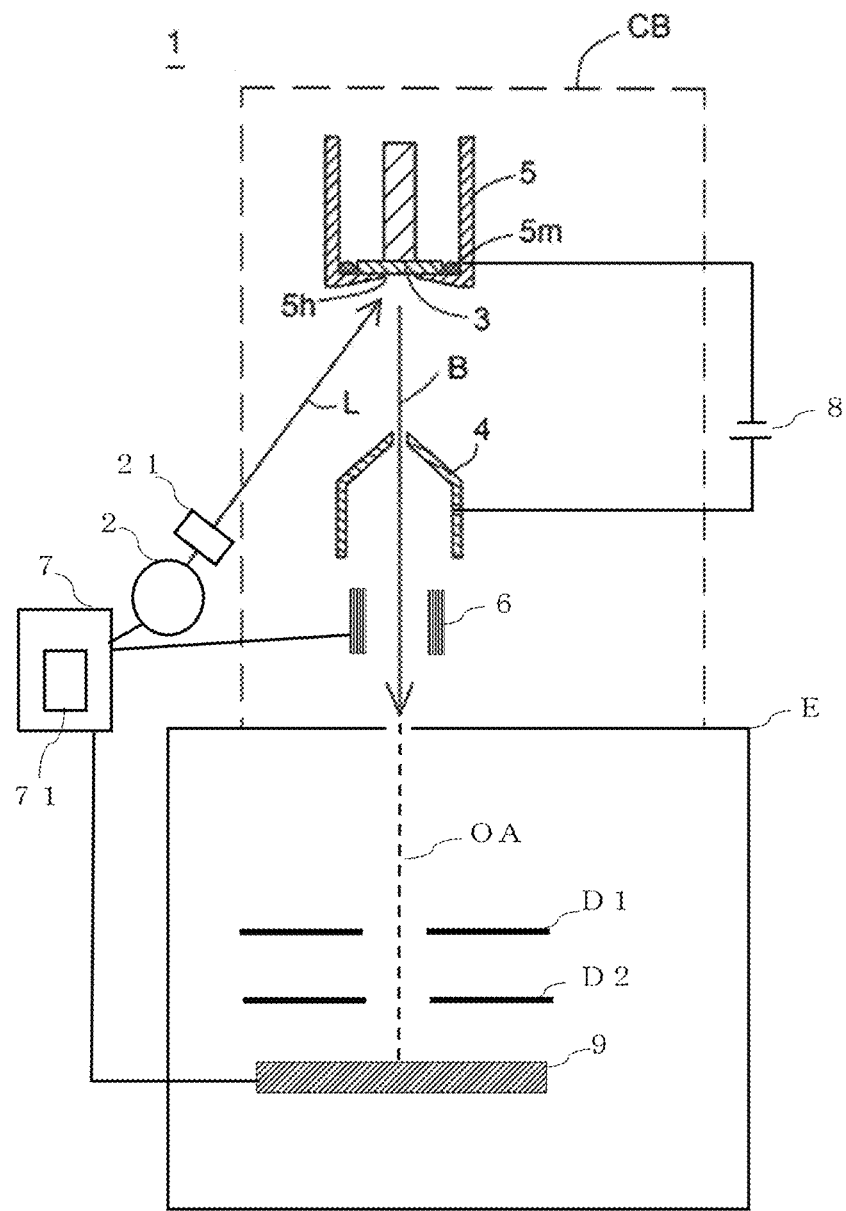
FIG. 1 is a schematic view illustrating an electron gun 1, and a device equipped with the electron gun 1.

A configuration example of an electron gun is described with reference to FIG. 1. FIG. 1 is a schematic view illustrating an electron gun 1, and a device E equipped with the electron gun 1 (below, as pertains to the device equipped with the electron gun 1, a portion other than the electron gun 1 is also referred to as a "counterpart device").

This embodiment of the electron gun 1 comprises at least a light source 2, a photocathode 3, an anode 4, an alignment device 6, an incident axis information processing device 7, and a power source 8. A detector 9 may also be provided as necessary.

There is no particular limitation as to the light source 2, provided that an electron beam B can be emitted due to the photocathode 3 being irradiated with excitation light L. Examples of the light source 2 include high-output (watt-class), high-frequency (hundreds of megahertz), ultrashort-pulse laser light sources, comparatively inexpensive laser diodes, and LEDs. The irradiated excitation light may be pulsed or continuous, and is preferably adjusted as appropriate in accordance with a purpose. In the example illustrated in FIG. 1, the light source 2 is disposed outside a vacuum chamber CB. Alternatively, the light source 2 may be disposed inside the vacuum chamber CB.

In the example illustrated in FIG. 1, the photocathode 3 is disposed inside the vacuum chamber CB. The photocathode 3 emits an electron beam B in response to receiving excitation light L radiated from the light source 2. More specifically, electrons in the photocathode 3 are excited by the excitation light L, and the excited electrons are emitted from the photocathode 3. The emitted electrons are accelerated by an electric field generated by an anode 4 and a cathode (including the photocathode 3), and an electron beam is formed. In the example shown in FIG. 1, the photocathode 3 is irradiated with the excitation light via the front surface thereof. Alternatively, the photocathode 3 may be irradiated with the excitation light via the rear surface thereof. In the example illustrated in FIG. 1, the photocathode 3 is disposed inside a photocathode-accommodating vessel 5 provided with an electron beam passage hole 5h. A treatment material 5m for subjecting the photocathode 3 to an EA surface treatment (i.e., an electron-affinity-lowering treatment) may be disposed within the photocathode-accommodating vessel 5.

There is no particular limitation as to a photocathode material for forming the photocathode 3, provided that it is possible for the photocathode material to emit an electron beam due to being irradiated with excitation light. Examples of the photocathode material include materials that require EA surface treatment, and materials that do not require EA surface treatment. Examples of materials that require EA surface treatment include III-V group semiconductor materials and II-VI group semiconductor materials. Specific examples include AlN, $Ce_2Te$, GaN, compounds of Sb with one or more alkali metals, AlAs, GaP, GaAs, GaSb, and InAs, as well as mixed crystals of these. Other examples of such materials include metals; specific examples include Mg, Cu, Nb, $LaB_6$, $SeB_6$, and Ag. The photocathode 3 can be fabricated by subjecting the photocathode material to EA surface treatment, and, with this photocathode 3, not only will it be possible to select excitation light from within a near-ultraviolet to infrared wavelength region corresponding to the gap energy of the semiconductor, but it will also be possible for the electron-beam source capabilities (quantum yield, durability, monochromaticity, temporal response, and spin polarization) corresponding to the electron beam application to be exhibited by selecting the material and structure of the semiconductor.

Examples of materials that do not require EA surface treatment include: Cu, Mg, Sm, Tb, Y, and other single metals, or alloys or metal compounds thereof; and diamond, WBaO, and $Cs_2Te$. A photocathode that does not require EA surface treatment is preferably fabricated through a publicly known method (for example, see Japanese Patent No. 3537779). In cases where a photocathode that does not require EA surface treatment is used as the photocathode 3, it is permissible for the photocathode-accommodating vessel 5 not to be disposed.

The alignment device 6 is for causing the electron beam B emitted from the photocathode 3 to coincide with the incident axis OA of an electron optical system of the counterpart device E equipped with the electron gun 1. There is no particular limitation as to the alignment device 6, provided that the emitting direction of the electron beam B emitted from the photocathode 3 can be deflected at a position set apart from the photocathode 3. Examples include beam deflectors and deflection coils in which two orthogonal sets of coils are installed and axial alignment can be carried out through two-dimensional deflection. The alignment device 6 is connected to the incident axis information processing device 7 and is controlled by the incident axis information processing device 7.

The incident axis information processing device 7 is, inter alia, a programmable logic controller (PLC) or a computer equipped with a memory 71 in which there is stored a program for executing the incident axis alignment method described below. In the example shown in FIG. 1, the incident axis information processing device 7 is connected to the light source 2, the alignment device 6, and the detector 9, and controls the operations of these components.

The power source 8 applies an acceleration voltage to the photocathode 3 and the anode 4 in order to accelerate the electrons emitted from the photocathode 3. Components that are publicly known in the field of electron guns 1 may be used as the anode 4 and the power source 8.

There is no particular limitation as to the detector 9, provided that it is possible to detect electrons (the electron beam) passing through apertures D1, D2 that define the incident axis OA of the electron optical system of the counterpart device E. Examples of the detector 9 include Faraday cups, scintillators, microchannel plates, and other electron detectors. The detector 9 may be formed as one of the constituent components of the electron gun 1, but when the counterpart device E is provided with a detector 9, the detector 9 in this instance may also be used. It is not necessary to provide the detector 9 to the electron gun 1. In the example shown in FIG. 1, the counterpart device E is provided with two apertures (D1, D2), but provided that there are at least two apertures, it is also permissible to use three, four, or another plural number.

(First Embodiment of Incident Axis Alignment Method)

Figure 2:
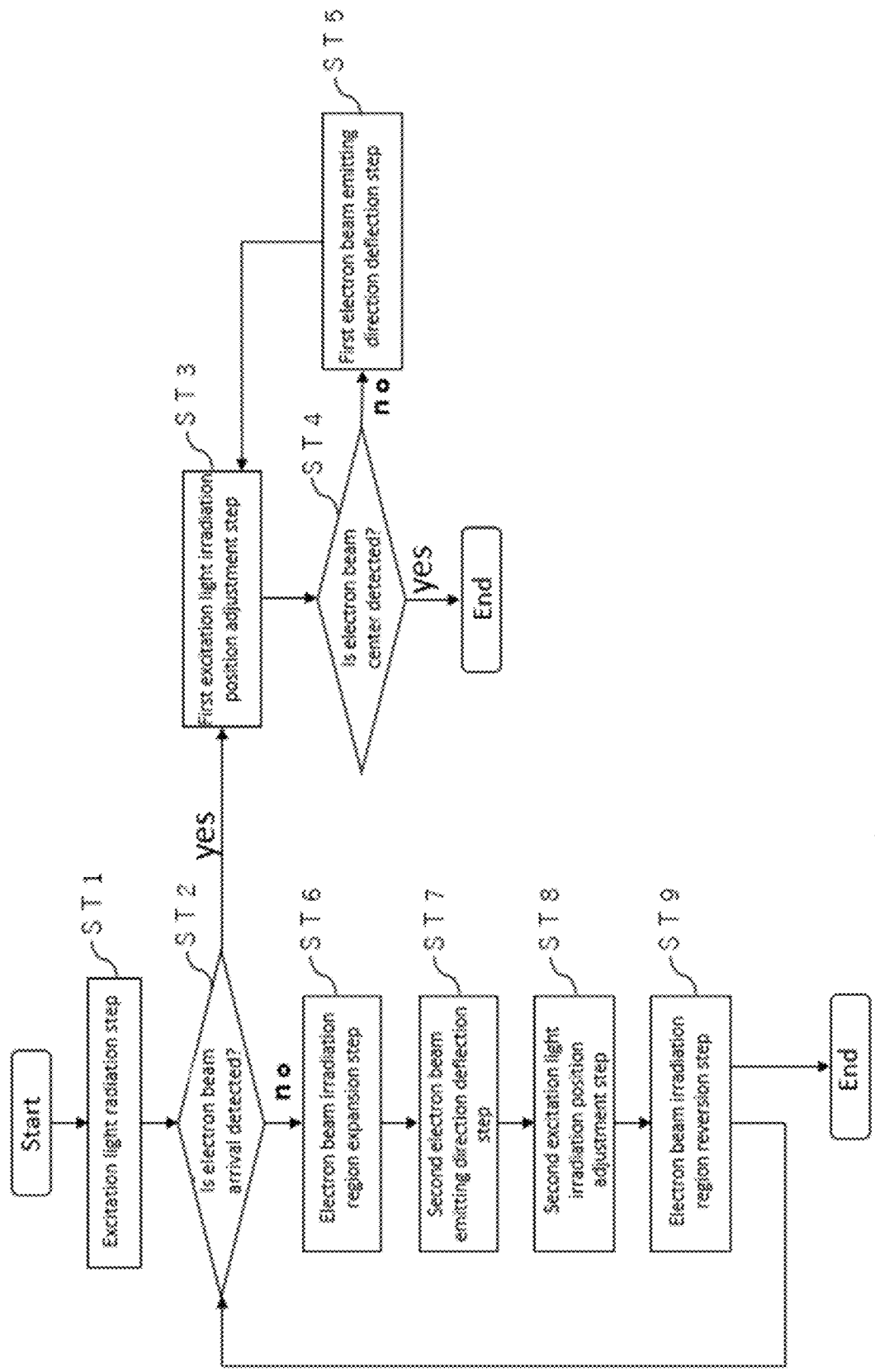
FIG. 2 is a flow chart showing one example of a first embodiment of an incident axis alignment method.
Figure 3:
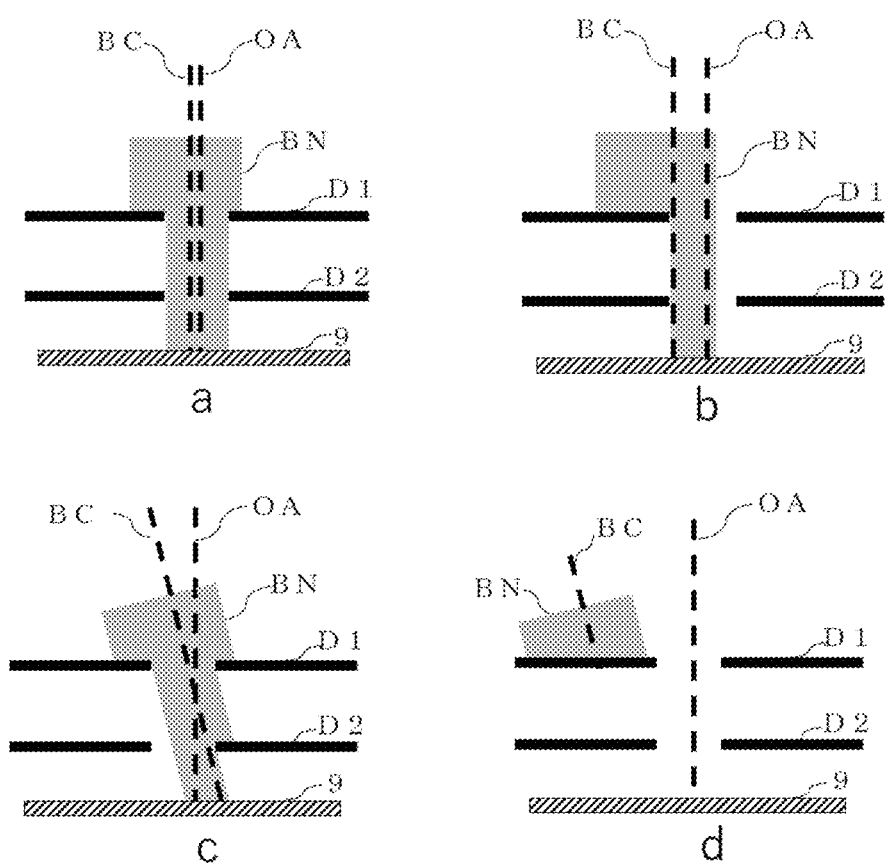
FIG. 3 is a view for illustrating a relationship between an electron beam BN arriving at a detector 9 and the amount of electric current detected by the detector 9 when the electron gun 1 was mounted on a counterpart device E.
Figure 4:
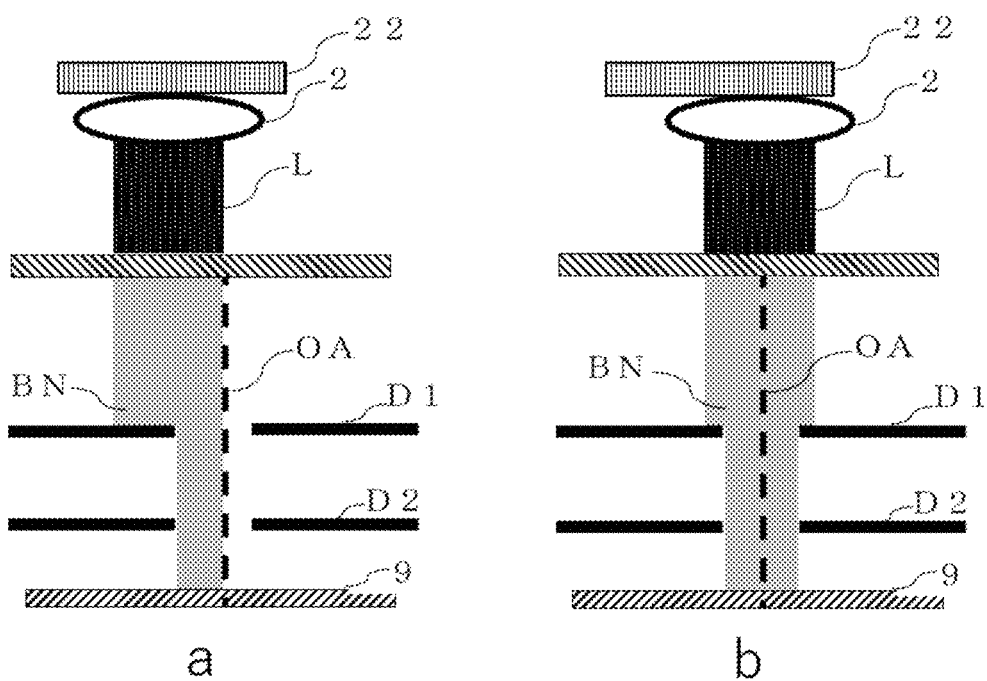
FIG. 4 is a view for illustrating an overview of a first excitation light irradiation position adjustment step (ST3)
Figure 5:
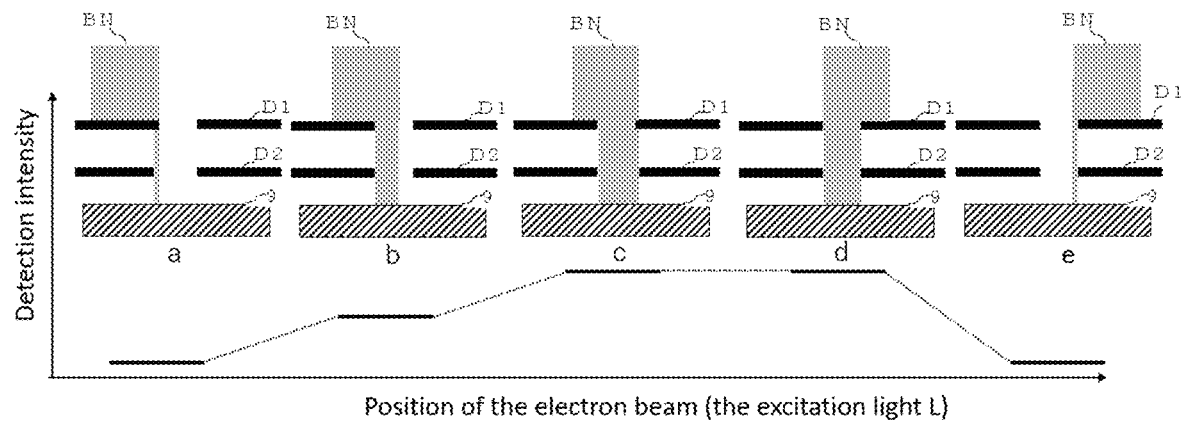
FIG. 5 is a view for illustrating a relationship between changes in the position of the electron beam BN when excitation light L is scanned and the intensity of electrons (amount of electric current) detected by the detector 9 in the first excitation light irradiation position adjustment step (ST3)
Figure 6:
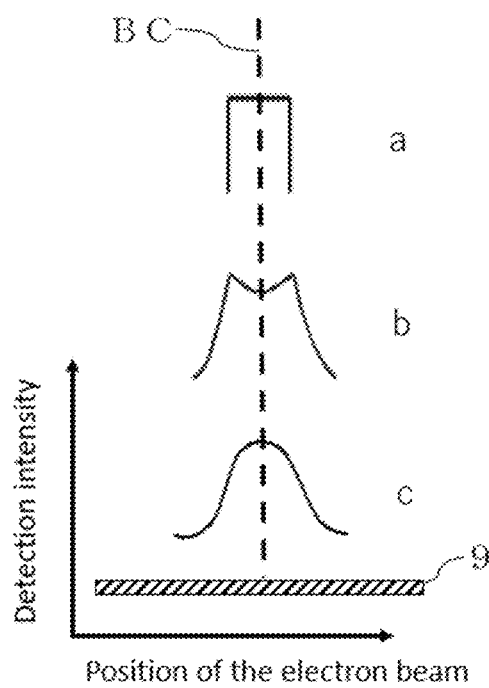
FIG. 6 is a view for illustrating a relationship between an irradiation region of the electron beam BN and the amount of electrons (amount of electric current)
Figure 7:
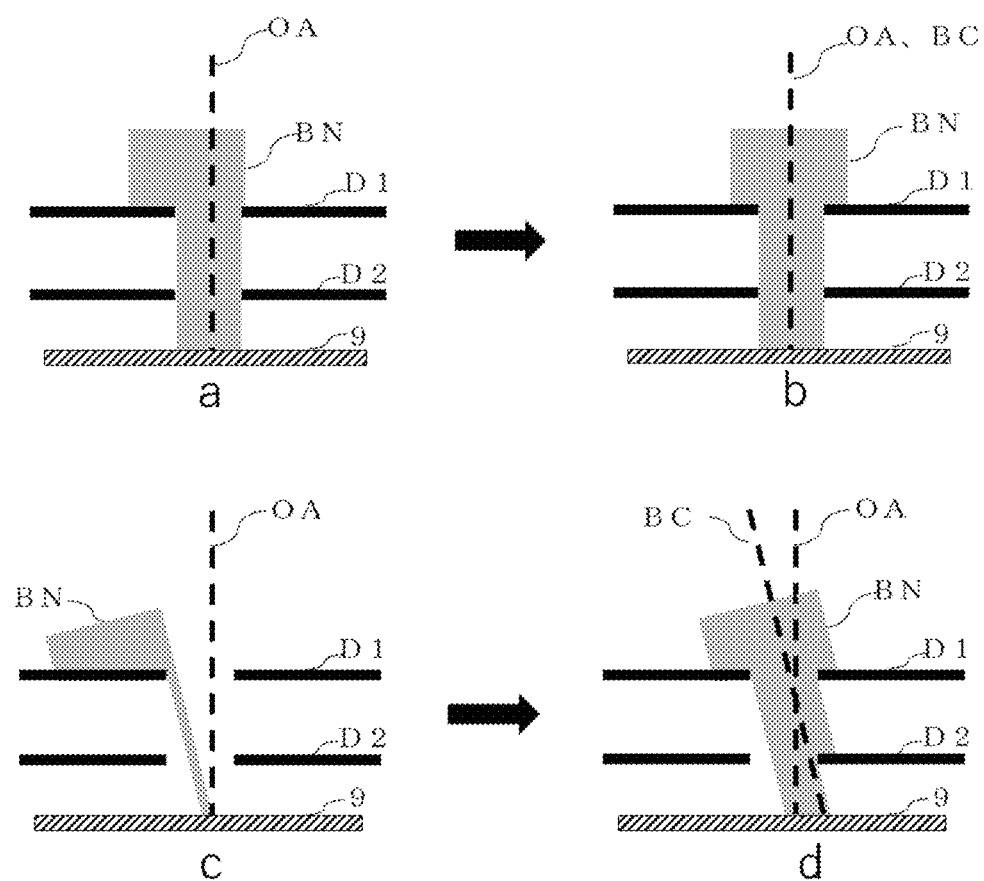
FIG. 7 is a view for illustrating an overview of an electron beam center detection step (ST4)
Figure 8:
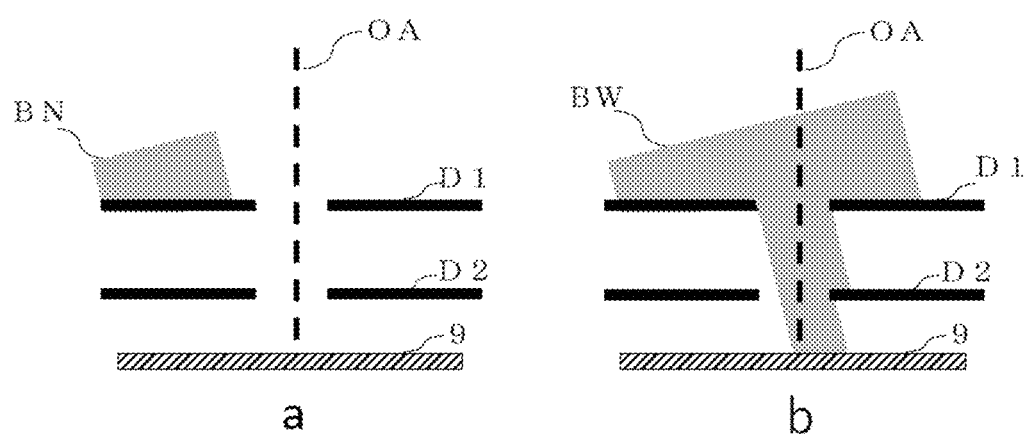
FIG. 8 is a view for illustrating an overview of an electron beam irradiation region expansion step (ST6)

An overview of a first embodiment of an incident axis alignment method for the electron gun is described with reference to FIGS. 1-8. FIG. 2 is a flow chart showing one example of the first embodiment of the incident axis alignment method. FIG. 3 is a view for illustrating a relationship between an electron beam BN arriving at the detector 9 and the amount of electric current detected by the detector 9 when the electron gun 1 was mounted on a counterpart device E. FIG. 4 is a view for illustrating an overview of a first excitation light irradiation position adjustment step (ST3). FIG. 5 is a view for illustrating a relationship between changes in the position of the electron beam BN when excitation light L is scanned and the intensity of electrons (amount of electric current) detected by the detector 9 in the first excitation light irradiation position adjustment step (ST3). FIG. 6 is a view for illustrating a relationship between an irradiation region of the electron beam BN and the amount of electric current. FIG. 7 is a view for illustrating an overview of an electron beam center detection step (ST4). FIG. 8 is a view for illustrating an overview of an electron beam irradiation region expansion step (ST6).

An excitation light radiation step is carried out in a first step ST1. In the excitation light radiation step (ST1), the photocathode 3 is irradiated with excitation light L from the light source 2, and an electron beam is emitted from the photocathode 3, as shown in FIG. 1. In the present specification, the electron beam emitted in response to the excitation light L radiated during normal operation of the electron gun 1 is defined as "an electron beam (BN) in a first state." The electron beam BN emitted from the photocathode 3 is accelerated by the acceleration voltage applied to the photocathode 3 and the anode 4 and is emitted toward the apertures D1, D2 of the counterpart device E equipped with the electron gun 1.

An electron beam arrival detection step is carried out in a second step ST2. In the electron beam arrival detection step (ST2), when the detector 9 has detected electrons, it is assessed that the electron beam BN has arrived (yes). However, when the detector 9 has not detected electrons, it is assessed that the electron beam BN has not arrived (no).

FIG. 3 is a view for illustrating the relationship between the electron beam BN that has arrived at the detector 9 and the amount of electric current detected by the detector 9 when the electron gun 1 was mounted on the counterpart device E. According to the relationship illustrated in FIG. 3, reference is made to the center line BC of the electron beam BN in the first state, and in the first embodiment of the incident axis alignment method, the center line BC of the electron beam BN in the first state is adjusted through steps described below so as to coincide with the incident axis OA of the electron optical system of the counterpart device E. FIG. 3a shows a state in which the center line BC of the electron beam BN in the first state is at least parallel to the incident axis OA of the electron optical system of the counterpart device E and in which the irradiation region of the electron beam BN covers the entirety of the aperture D1. In the case shown in FIG. 3a, an electron beam having a cross-sectional area equal to the area of the holes in the apertures D1, D2 arrives at the detector 9. FIG. 3b shows a state in which the center line BC of the electron beam BN in the first state is at least parallel to the incident axis OA of the electron optical system of the counterpart device E and in which the irradiation region of the electron beam BN covers only a partial region of the aperture D1. In the case shown in FIG. 3b, only a portion of the electron beam BN that has passed through the holes in the apertures D1, D2 arrives at the detector 9. FIG. 3c shows a state in which the center line BC of the electron beam BN in the first state is inclined with respect to the incident axis OA of the electron optical system of the counterpart device E. In the case shown in FIG. 3c, a portion of the electron beam BN having a cross-sectional area almost equal to the area of the aperture D1 passes through the aperture D1. However, because a portion of the electron beam BN that passed through the aperture D1 is blocked by the aperture D2, the cross-sectional area of the electron beam BN that arrives at the detector 9 is decreased. FIG. 3d shows a state in which the irradiation region of the electron beam BN in the first state is completely offset from the hole in the aperture D1. In the case shown in FIG. 3d, the electron beam BN does not arrive at the detector 9. In the examples shown in FIG. 3, the holes in the apertures D1, D2 are of the same size, but the holes in the apertures D1, D2 may instead be of different sizes.

In the electron beam arrival detection step (ST2), in cases where even a small amount of electric current is detected by the detector 9, e.g., in the cases shown in FIGS. 3a to 3c, it is assessed that the electron beam BN has arrived (yes). In cases where the assessment "yes" is made, it can be said that the electron gun 1 has been mounted at an expected position or a substantially expected position. However, in cases where the detector 9 does not detect any electrons, as shown in FIG. 3d, it is assessed that the electron beam BN has not arrived (no). In cases where the assessment "no" is made, it can be said that the electron gun 1 has been mounted at a position offset from the expected position.

In cases where the assessment "yes" is made in the electron beam arrival detection step (ST2), a first excitation light irradiation position adjustment step (ST3) is carried out in a third step ST3. FIG. 4 is a view for illustrating an overview of the first excitation light irradiation position adjustment step (ST3). According to the illustrated relationship, the incident direction of excitation light L relative to the photocathode 3 in FIG. 4 differs from that in FIG. 1, but excitation light L may be radiated from either direction. FIG. 4a shows a state before the excitation light L is scanned, and FIG. 4b shows a state after the excitation light L is scanned. The first excitation light irradiation position adjustment step (ST3) is implemented by changing (scanning) the irradiation position of the excitation light L using an excitation light radiation direction control device 22. The excitation light radiation direction control device 22 is described in detail below.

FIG. 5 is a view for illustrating a relationship between changes in the position of the electron beam BN when the excitation light L is scanned and the intensity of electrons (amount of electric current) detected by the detector 9 in the first excitation light irradiation position adjustment step (ST3). Description of the light source 2, the excitation light radiation direction control device 22, the photocathode 3, and the excitation light L is omitted in FIG. 5. As shown in FIG. 5, when the irradiation position of the excitation light L is changed (scanned), the position of the electron beam BN arriving at the aperture D1 also changes. However, as shown in FIGS. 5c and 5d, even if the irradiation position of the excitation light L (arrival position of the electron beam BN) changes, there is a range within which the intensity of the electrons (amount of electric current) detected by the detector 9 does not change. In the first excitation light irradiation position adjustment step (ST3), the excitation light L is broadly scanned in X-axis and Y-axis directions, i.e., in a plane that includes the aperture D1, whereby the irradiation position of the excitation light L and the amount of electric current detected by the detector 9 are stored in association with each other in the incident axis information processing device 7. A determination is then made as to an irradiation region of the excitation light L in which the intensity of electrons detected by the detector 9 is the same, and the center of the determined irradiation region is stored in the incident axis information processing device 7 as the irradiation center of the excitation light L. When the excitation light L is radiated so that the center of the excitation light L coincides with the stored irradiation center, the center line BC of the emitted electron beam BN coincides with the incident axis OA of the electron optical system of the counterpart device E.

FIG. 5 shows a case where the electron beam BN is parallel to the incident axis of the electron optical system of the counterpart device, but even in cases where the electron beam BN is inclined with respect to the incident axis of the electron optical system of the counterpart device, a determination is similarly made as to the irradiation center of the excitation light L using the same procedure as described above, and the result of determination is similarly stored in the incident axis information processing device 7.

FIG. 6 is a view for illustrating a relationship between the irradiation region of the electron beam BN and the amount of electrons (amount of electric current). Due to, inter alia, the conditions under which the electron beam BN is emitted, the intensity within the irradiation region of the electron beam BN may be the same at all positions within the irradiation region as shown in FIG. 6a or may be weaker at peripheral edge parts of the irradiation region as shown in FIGS. 6b and 6c. However, in all of the cases shown in FIGS. 6a to 6c for the intensity within the irradiation region of the electron beam BN, storing the irradiation position of the excitation light L and the amount of electric current detected by the detector 9 in association with each other as shown in FIG. 5 makes it possible to determine the center of the irradiation region of the excitation light L, at which the intensity of electrons detected by the detector 9 is the same.

The electron beam center detection step (ST4) is carried out in a fourth step ST4. In the electron beam center detection step (ST4), it is detected whether the center line BC of the electron beam BN in the first state coincides with the incident axis OA of the electron optical system of the counterpart device E. The term "coincide" is not limited to cases where the center line BC of the electron beam BN in the first state and the incident axis OA of the electron optical system of the counterpart device E completely coincide, but rather includes coinciding within a preset range of deviation. FIG. 7 is a view for illustrating an overview of the electron beam center detection step (ST4). The amount of electrons emitted from the photocathode 3 can be calculated on the basis of the radiation intensity of the excitation light L. The area of the apertures D1, D2 can also be calculated. Therefore, it is possible to calculate the maximum value of the amount of electric current detected by the detector 9 in accordance with the intensity of the excitation light L. Alternatively, the maximum value of the amount of electric current detected by the detector 9 can be derived from actual measured values. Therefore, in the electron beam center detection step (ST4), a threshold value is set with reference to the maximum value of the amount of electric current detected by the detector 9, and when the excitation light L is radiated at the position stored in the incident axis information processing device 7 in the first excitation light irradiation position adjustment step (ST3), the assessment "yes" is made in cases where the amount of electric current detected by the detector 9 is greater than the threshold value, and the assessment "no" is made in cases where the amount of electric current detected by the detector 9 is less than the threshold value. The threshold value is preferably set as appropriate to, inter alia, 90% or more or 95% or more of the maximum value. The extent to which the center line BC of the electron beam BN in the first state coincides with the incident axis OA of the electron optical system of the counterpart device E (the preset range of deviation) can be adjusted in accordance with the threshold value.

For example, suppose the electron beam BN for which the assessment "yes" was made in the electron beam arrival detection step (ST2) is parallel to the incident axis OA of the electron optical system of the counterpart device E, as shown in FIG. 7a. In this case, when the excitation light L is radiated at the position stored in the incident axis information processing device 7 in the first excitation light irradiation position adjustment step (ST3), the center line BC of the electron beam BN emitted from the photocathode 3 coincides with the incident axis OA of the electron optical system of the counterpart device E, as shown in FIG. 7b. Accordingly, the electron beam BN that has arrived at the aperture D1 is not blocked by the aperture D2, and therefore the amount of electrons (amount of electric current) is equal to or greater than the threshold value set with reference to the maximum value of the amount of electrons (amount of electric current), and the assessment "yes" is made in the electron beam center detection step (ST4). In cases where the assessment "yes" is made in the electron beam center detection step (ST4), alignment is suitably implemented, and therefore the process is ended.

By contrast, suppose the electron beam BN for which the assessment "yes" was made in the electron beam arrival detection step (ST2) is inclined with respect to the incident axis OA of the electron optical system of the counterpart device E, as shown in FIG. 7c. In this case, when the excitation light L is radiated at the position stored in the incident axis information processing device 7 in the first excitation light irradiation position adjustment step (ST3), the center line BC of the electron beam BN emitted from the photocathode 3 does not coincide with the incident axis OA of the electron optical system of the counterpart device E, as shown in FIG. 7d. Therefore, as shown in FIG. 7d, a portion of the electron beam BN that has passed through the aperture D1 is blocked by the aperture D2, and the amount of electric current detected by the detector 9 is lower than the maximum value of the amount of electric current. In cases where the amount of electric current measured is less than the threshold value as in FIG. 7d, the assessment "no" is made in the electron beam center detection step (ST4), and the process advances to a fifth step ST5.

A first electron beam emitting direction deflection step (ST5) is carried out in the fifth step ST5. As shown in FIG. 7d, in cases where the electron beam BN has arrived at the aperture D1 in a state of being inclined with respect to the incident axis OA of the electron optical system of the counterpart device E, the electron beam BN is blocked by the aperture D2. Therefore, in the first electron beam emitting direction deflection step (ST5), the alignment device 6 is driven using the incident axis information processing device 7 and emitting direction of the electron beam BN emitted from the photocathode 3 is deflected, as shown in FIG. 1. The deflection of the emitting direction of the electron beam BN and the detection carried out by the detector 9 are repeated, and a value (deflection amount of the electron beam BN) at which the amount of electric current detected by the detector 9 is maximized is determined and stored in the incident axis information processing device 7. In cases where a deflection coil is used as the alignment device 6, the deflection amount of the electron beam BN can be adjusted through the amount of electricity passing through the coil.

After the first electron beam emitting direction deflection step (ST5) has ended, the first excitation light irradiation position adjustment step (ST3) is implemented again while the electron beam BN is deflected under the deflection conditions set in the first electron beam emitting direction deflection step (ST5), whereby the electron beam BN, which is closer to being parallel to the incident axis OA of the electron optical system of the counterpart device E, can be radiated toward the aperture D1. Thereafter, steps ST5, ST3, and ST4 are preferably repeated in a loop until the assessment "yes" is made in step ST4. Repeating the loop makes it possible to raise the accuracy of alignment.

In cases where more accurate alignment is required, fine adjustments may be made by repeating the loop of steps ST5, ST3, and ST4 a prescribed number of times, as needed, after the assessment "yes" has been made in step ST4.

Next, in cases where it has been assessed that the electron beam BN has not arrived (no) in the electron beam arrival detection step (ST2), the process advances to a sixth step ST6, in which an electron beam irradiation region expansion step (ST6) is carried out. FIG. 8 is a view for illustrating an overview of the electron beam irradiation region expansion step (ST6). FIG. 8a shows the electron beam BN in the first state before the electron beam irradiation region expansion step (ST6) is implemented, and FIG. 8b shows an electron beam after the electron beam irradiation region expansion step (ST6) is implemented (below, the expanded electron beam is referred to as an "electron beam BW").

As shown in FIG. 8a, the electron gun 1 equipped with the photocathode 3 emits the electron beam BN in the first state due the photocathode 3 being irradiated with the excitation light L. However, in cases where the deviation from the expected position is high when the electron gun 1 was mounted on the counterpart device E, there are cases where the electron beam BN in the first state does not irradiate the region of the aperture D1 at all. In these cases, adjustment of the position at which the electron gun 1 is mounted and detection carried out by the detector 9 must be repeated through conventional methods so that the electron beam BN arrives at the detector 9.

However, in the first embodiment of the incident axis alignment method, the irradiation region of the electron beam BW that arrives at the aperture D1 of the counterpart device is expanded in the electron beam irradiation region expansion step (ST6) to a greater extent than the irradiation region of the electron beam BN in the first state, as shown in FIG. 8b. Therefore, the electron beam BW passes through the apertures D1, D2 even when the position at which the electron gun 1 is mounted slightly deviates from the expected position, and the electron beam is readily detected by the detector 9. Therefore, an operation to repeatedly adjust the position at which the electron gun 1 is mounted and carry out detection using the detector 9 is unnecessary, or the number of times such an operation must be carried out is reduced, and the time required for alignment can be shortened.

In the present specification, "expanding to a greater extent than the irradiation region of the electron beam BN in the first state" refers to a feature in which, after "the electron beam irradiation region expansion step," the irradiation region of the electron beam BW irradiating the aperture D1 of the counterpart device E (i.e., supposing that the aperture D1 is a level surface, the area at which the electron beam B arrives) is expanded to a greater extent than the irradiation region of the electron beam BN in the first state. Alternatively, "expanding to a greater extent than the irradiation region of the electron beam BN in the first state" may refer to the cross-sectional area in directions substantially orthogonal to the center line BC of the electron beam (BN, BW), rather than the region actually irradiated with the electron beam (BN, BW). As shown in FIGS. 8a and 8b, "expanding to a greater extent than the irradiation region of the electron beam BN in the first state" also includes a feature in which the irradiation region of a single electron beam radiated from the photocathode is widened to a greater extent than the irradiation region of the electron beam BN in the first state and the radiation direction of the electron beam BN in the first state is continuously changed, whereby the irradiation region of the electron beam irradiating the aperture D1 widens. Various embodiments of the electron beam irradiation region expansion step (ST6) are described below.

A second electron beam emitting direction deflection step (ST7) is carried out in a seventh step ST7. The second electron beam emitting direction deflection step (ST7) can be implemented using the same procedures as in the first electron beam emitting direction deflection step (ST5), except that what is deflected is the electron beam BW that was expanded in the electron beam irradiation region expansion step (ST6).

A second excitation light irradiation position adjustment step (ST8) is carried out in an eighth step (ST8). The second excitation light irradiation position adjustment step (ST8) can be implemented using the same procedures as in the first excitation light irradiation position adjustment step (ST3), except that the electron beam BW that was expanded in the electron beam irradiation region expansion step (ST6) is used, and the irradiation position of the excitation light L is changed (scanned) in a state in which the direction of the electron beam BW that was deflected in the second electron beam emitting direction deflection step (ST7) is maintained (the deflection conditions of the alignment device 6 are maintained). The center of the irradiation region as determined in the second excitation light irradiation position adjustment step (ST8) is stored in the incident axis information processing device 7 as the irradiation center of the excitation light L, and when the excitation light L is radiated so that the center of the excitation light L coincides with the stored irradiation center, the center line BC of the emitted electron beam BN coincides with the incident axis OA of the electron optical system of the counterpart device E.

An electron beam irradiation region reversion step is carried out in a ninth step ST9. In the electron beam irradiation region reversion step (ST9), the electron beam BW is preferably restored to the electron beam BN in the first state using procedures that are the reverse of those in the electron beam irradiation region expansion step (ST6). In this instance, reversion is preferably carried out so that the center of the excitation light L coincides with the irradiation center stored in the second excitation light irradiation position adjustment step (ST8).

After the electron beam irradiation region reversion step (ST9) has ended, the process preferably returns to the electron beam arrival detection step (ST2), whereby it is confirmed whether the electron beam BN that has been restored to the first state is correctly aligned. After the assessment "no" is made in the electron beam arrival detection step (ST2), deflection of the electron beam BW is carried out through the second electron beam emitting direction deflection step (ST7). Therefore, the center line BC of the electron beam BW after the second electron beam emitting direction deflection step (ST7) becomes at least parallel with the incident axis OA of the electron optical system of the counterpart device E. Therefore, after the electron beam irradiation region reversion step (ST9) has been implemented, alignment may be considered to have been suitably implemented, and the process may be ended.

The first embodiment of the incident axis alignment method is implemented by carrying out the steps described above, but steps may be added, modified, or omitted, provided that the resulting method is within a range in which incident axis alignment can be implemented. For example, the second electron beam emitting direction deflection step (ST7) may not be included, i.e., may be an optional step. The second electron beam emitting direction deflection step (ST7) may be carried out after the second excitation light irradiation position adjustment step (ST8). The first electron beam emitting direction deflection step (ST5) may be provided between the first excitation light irradiation position adjustment step (ST3) and the electron beam center detection step (ST4), and in cases where the result of the electron beam center detection step (ST4) is an assessment of "no," the process may return to the first excitation light irradiation position adjustment step (ST3). Alternatively, the first electron beam emitting direction deflection step (ST5) may be provided between the electron beam arrival detection step (ST2) and the first excitation light irradiation position adjustment step (ST3), and in cases where the result of the electron beam center detection step (ST4) is an assessment of "no," the process may return to the first electron beam emitting direction deflection step (ST5). As described above, a major feature of the electron gun equipped with the photocathode, unlike with conventional electron guns, is that it is possible to readily adjust the position of the electron beam emitted from the photocathode by changing the position of excitation light with which the photocathode is irradiated. Therefore, in cases where it is possible to raise the precision of attachment by creating an attachment structure of a mounting portion of the electron gun 1 with respect to the counterpart device E in a refined manner, the process may advance directly to the first excitation light irradiation position adjustment step (ST3) after the excitation light radiation step (ST1). The modifications provided as examples above may be made alone or in combination.

Various embodiments in which the steps in the first embodiment of the incident axis alignment method are specified in greater detail are described below.

Embodiment A

Figure 9:
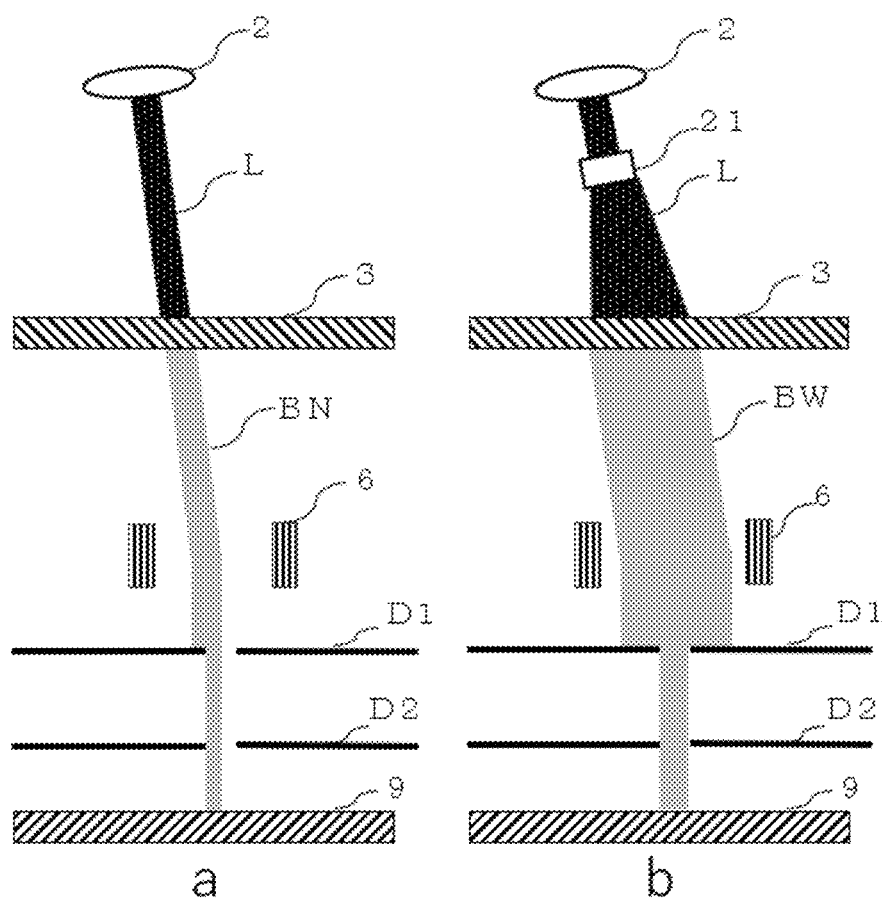
FIG. 9 is a view for illustrating embodiment A.
Figure 10:
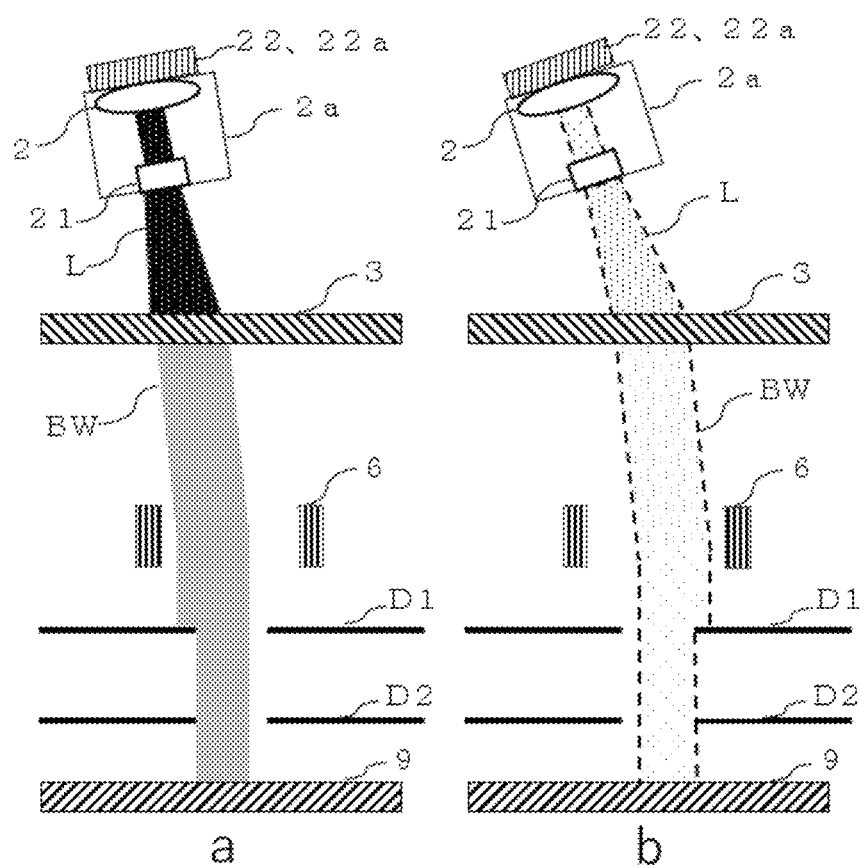
FIG. 10 is a view for illustrating embodiment A.

Embodiment A is described with reference to FIGS. 1, 9, and 10. FIGS. 9a and 9b are views for illustrating specific examples of the electron beam irradiation region expansion step (ST6). In embodiment A, as shown in FIGS. 9a and 9b, the electron beam radiation region expansion step (ST6) is carried out by expanding the irradiation region of the excitation light L being incident on the photocathode 3. As shown in FIGS. 9a and 9b, the radiation region of the electron beam emitted from the photocathode 3 expands commensurately with expansion of the radiation region of the excitation light L. Therefore, in embodiment A, in cases where FIG. 9a is considered to show the electron beam BN in the first state, the irradiation region of the excitation light L with which the photocathode 3 is irradiated is expanded to a greater extent than the irradiation region of the excitation light L for emitting the electron beam BN in the first state, as shown in FIG. 9b. In the example shown in FIG. 9b, the irradiation region of the excitation light L is expanded using an excitation light irradiation region adjustment device 21 provided between the light source 2 and the photocathode 3.

There is no particular limitation as to the excitation light irradiation region adjustment device 21, provided that it is possible to expand the irradiation region of the excitation light L; examples include optical devices (methods). In cases where the excitation light L is converged during normal operation (during emission of the electron beam BN in the first state), specific examples of optical devices include removal of a condenser lens, defocusing, addition of a concave lens, and other means (methods). In cases where substantially parallel excitation light is radiated during normal operation, a lens may be inserted, or the excitation light L may be expanded using a beam expander, etc. Instead of a lens or other transmissive optical system, a reflecting optical system in which a curved mirror, etc., is used may be used as the optical device (method).

FIGS. 10a and 10b are views showing an example of an embodiment for changing the irradiation position of the excitation light L in the second excitation light irradiation position adjustment step (ST8). FIG. 10a is a view showing a state in which the irradiation region of the excitation light L has been expanded through the electron beam irradiation region expansion step (ST6), and FIG. 10b is a view showing a state after the irradiation position of the excitation light L has been changed (scanned) through the second excitation light irradiation position adjustment step (ST8). In the example shown in FIGS. 10a and 10b, the light source 2 and the excitation light irradiation region adjustment device 21 are handled integrally as a light source unit 2a, and an excitation light radiation direction control device 22 that controls the direction of the excitation light L emitted from the light source unit 2a is provided. There is no particular limitation as to the excitation light radiation direction control device 22, provided that it is possible to control the direction of the excitation light L emitted from the light source unit 2a. For example, in the example shown in FIGS. 10a and 10b, a light source unit turning device 22a that changes the position at which the photocathode 3 is irradiated with the excitation light L emitted from the light source unit 2a is provided as the excitation light radiation direction control device 22. There is no particular limitation as to the light source unit turning device 22a, provided that it is possible to turn the light source unit 2a; for example, a publicly known turning mechanism with which the attached light source unit 2a can be turned in any direction is preferably used. In the embodiment shown in FIGS. 10a and 10b, it is preferable that turning the light source unit 2a and changing (scanning) the irradiation position of the excitation light L makes it possible to determine the position at which the center line BC of the electron beam BW coincides with the incident axis OA of the electron optical system of the counterpart device E, and that the turning position of the light source unit turning device 22a in this instance is stored in the incident axis information processing device 7. A light source unit planar-direction movement device that moves the light source unit 2a in a planar direction may be used instead of turning the light source unit 2a. A publicly known movement mechanism that can move in X-axis and Y-axis directions can be used as the planar-direction movement device. In cases where a light source unit planar-direction movement device is used, the position (X-axis and Y-axis coordinates) at which the center line BC of the electron beam BW coincides with the incident axis OA of the electron optical system of the counterpart device E is preferably stored in the incident axis information processing device 7. Specifically, in the embodiment shown in FIGS. 10a and 10b, the incident axis information processing device 7 is connected to and controls both the excitation light irradiation region adjustment device 21 and the excitation light radiation direction control device 22. In the first excitation light irradiation position adjustment step (ST3), the irradiation position of the excitation light L is preferably changed (scanned) in a state in which the excitation light irradiation region adjustment device 21 is not caused to function.

In the electron beam irradiation region reversion step (ST9), it is preferable that the incident axis information processing device 7 first carries out a control for driving the light source unit turning device 22a so as to reach the stored turning position, or a control for driving the light source unit planar-direction movement device so as to reach the stored X-axis and Y-axis coordinates, and then causes the excitation light irradiation region adjustment device 21 to revert to the normal operation state. In embodiment A, portions that are not referred to in particular are preferably carried out using the same procedures as in the first embodiment of the incident axis alignment method.

Embodiment B

Figure 11:
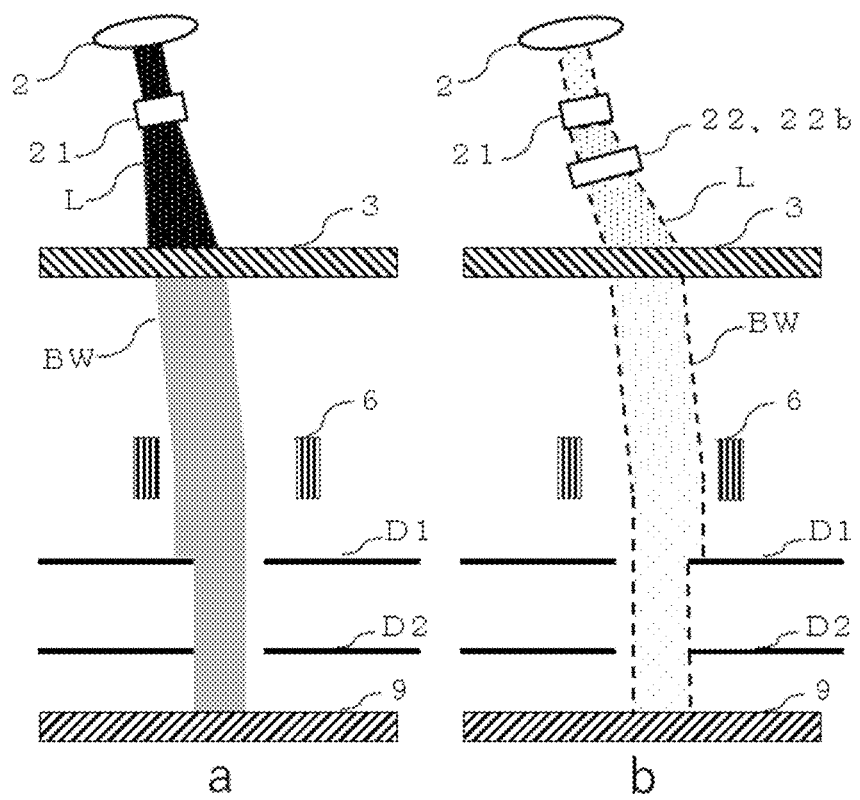
FIG. 11 is a view for illustrating embodiment B.

Embodiment B is described with reference to FIGS. 11a and 11b. FIG. 11a is a view showing a state in which the irradiation region of the excitation light L has been expanded through the electron beam irradiation region expansion step (ST6), and FIG. 11b is a view showing a state in which the irradiation position of the excitation light L has been changed (scanned) through the second excitation light irradiation position adjustment step (ST8). Embodiment B differs from embodiment A in that, in the second excitation light irradiation position adjustment step (ST8), an excitation light scanning device 22b is used as the excitation light radiation direction control device 22 instead of the light source unit turning device 22a (the light source unit planar-direction movement device).

There is no particular limitation as to the excitation light scanning device 22b, provided that the excitation light scanning device 22b is provided between the excitation light irradiation region adjustment device 21 and the photocathode 3, as shown in FIG. 11b, and it is possible to change the radiation direction of the excitation light L expanded by the excitation light irradiation region adjustment device 21. Specific examples of the excitation light scanning device 22b include polygonal mirrors, MEMS mirrors, and galvanic mirrors. Using the excitation light scanning device 22b makes it possible to control the direction of the excitation light L emitted from the light source 2, and as a result, it is possible to continuously change the position at which the photocathode 3 is irradiated with the excitation light L and to continuously change the position of the electron beam BW emitted from the photocathode 3. In embodiment B, changing (scanning) the irradiation position of the excitation light L using the excitation light scanning device 22b preferably makes it possible to determine the position at which the center line BC of the electron beam BW coincides with the incident axis OA of the electron optical system of the counterpart device E, and in such instance, the control conditions of the excitation light scanning device 22b are preferably stored in the incident axis information processing device 7.

In the electron beam irradiation region reversion step (ST9), the incident axis information processing device 7 preferably carries out a control so that the control conditions of the excitation light scanning device 22b reach the stored conditions, and then restores the excitation light irradiation region adjustment device 21 to a normal operation state.

In embodiment B, an example is illustrated in which the excitation light scanning device 22b is provided instead of the light source unit turning device 22a (the light source unit planar-direction movement device); however, the light source unit turning device 22a (the light source unit planar-direction movement device) and the excitation light scanning device 22b may be used in combination as the excitation light radiation direction control device 22.

Embodiment C

Figure 12:
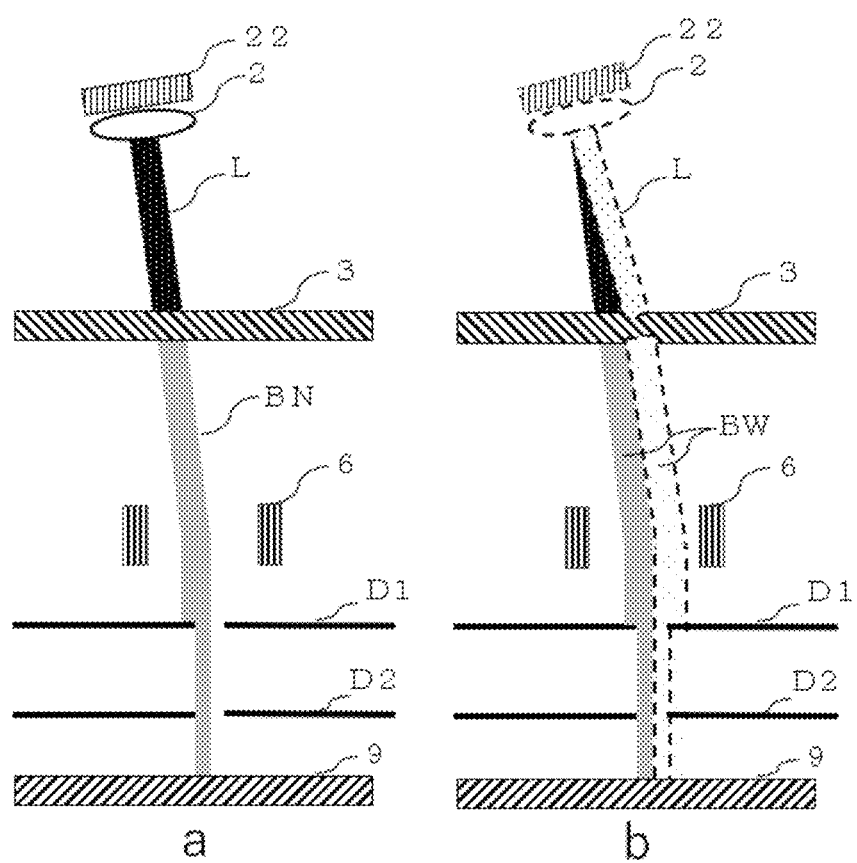
FIG. 12 is a view for illustrating embodiment C.

Embodiment C is described with reference to FIGS. 1 and 12. FIG. 12a is a view showing the electron beam BN in the first state in embodiment C. FIG. 12b is a view showing the electron beam BW after the electron beam BN has been expanded through the electron beam irradiation region expansion step (ST6) in embodiment C. In embodiments A and B, the excitation light L emitted from the light source 2 is expanded using the excitation light source irradiation region adjustment device 21 and the photocathode 3 is irradiated with the expanded excitation light L in the electron beam irradiation region expansion step (ST6), whereas in embodiment C, there is a difference in that the irradiation region of the electron beam B is expanded by the photocathode 3 being irradiated with the excitation light L while the excitation light L is scanned.

In the example shown in FIGS. 12a and 12b, an example is illustrated in which the excitation light radiation direction control device 22 is used as device for continuously changing the irradiation position of the excitation light L. In embodiment A, the excitation light radiation direction control device 22 causes the light source unit 2a including the light source 2 and the excitation light irradiation region adjustment device 21 to move in a turning or parallel manner. However, in the example shown in FIGS. 12a and 12b, although the excitation light radiation direction control device 22 differs by directly causing the light source 2 to move in a turning or parallel manner, it is possible to use devices that are similar to the light source unit turning device and the light source unit planar-direction movement device of embodiment A. In addition, in embodiment C, the excitation light scanning device 22b of embodiment B may be used without modification to carry out the electron beam irradiation region expansion step (ST6) (although this possibility is not shown) instead of the excitation light radiation direction control device 22 that directly causes the light source 2 to move in a turning or parallel manner. The turning device (planar-direction movement device) of the light source 2 and the excitation light scanning device 22b may be used in combination.

In embodiment C, in cases where the excitation light L is scanned in a wide area, the electron beam BW might not arrive at the detector 9 depending on the irradiation position of the excitation light L. Therefore, the incident axis information processing device 7 preferably stores, in advance, a scanning region of the excitation light L when the detecting electron beam BW has arrived at the detector 9, and the excitation light L is preferably scanned in the stored scanning region in the second electron beam emitting direction deflection step (ST7).

In the second excitation light irradiation position adjustment step (ST8), it is possible to determine the position at which the center line BC of the electron beam BW coincides with the incident axis OA of the electron optical system of the counterpart device E by scanning the excitation light L using the excitation light radiation direction control device 22. The turning position or the X-axis and Y-axis coordinates determined by the scanning are preferably stored in the incident axis information processing device 7 in the same manner as in embodiment A. In cases where the excitation light scanning device 22b is used as the excitation light radiation direction control device 22, the determined control conditions of the excitation light radiation direction control device 22 are preferably stored in the incident axis information processing device 7.

In the electron beam irradiation region reversion step (ST9), the incident axis information processing device 7 preferably carries out a drive control of the excitation light radiation direction control device 22 so as to reach the turning position or the X-axis and Y-axis coordinates stored in the second excitation light irradiation position adjustment step (ST8), or preferably carries out setting to the stored control conditions of the excitation light scanning device 22b.

Embodiment D

Figure 13:
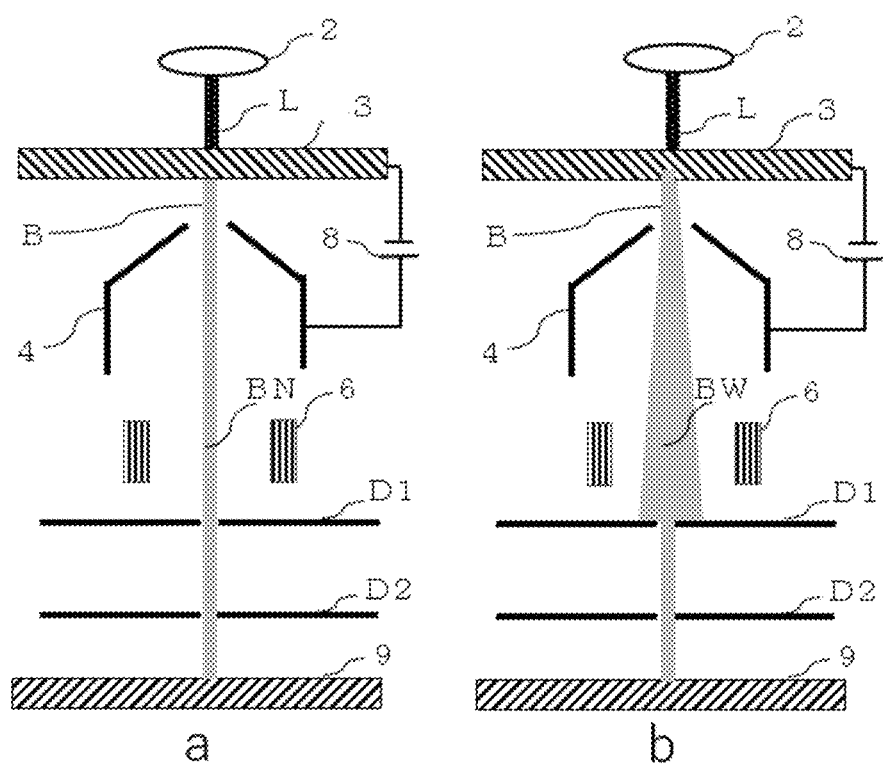
FIG. 13 is a view for illustrating embodiment D.

Embodiment D is described with reference to FIGS. 1 and 13. The incident axis information processing device 7 is also connected to the power source 8 (although this is not shown in FIGS. 1 and 13). In embodiments A through C, the excitation light L between the light source 2 and the photocathode 3 is controlled, but in embodiment D, the electron beam irradiation region is expanded by changing the acceleration voltage that is applied to the electron beam emitted from the photocathode 3, as shown in FIG. 13b. As shown in FIG. 13a, the irradiation region of the electron beam BN emitted from the photocathode 3 shrinks as the acceleration voltage applied between the photocathode 3 and the anode 4 increases. By contrast, as shown in FIG. 13b, the irradiation region of the electron beam BW expands as the acceleration voltage decreases. Therefore, in cases where FIG. 13a is considered to show the electron beam BN in the first state, reducing the acceleration voltage less than the acceleration voltage when the electron beam in the first state is radiated makes it possible to expand the electron beam irradiation region in embodiment D. In the electron beam irradiation region reversion step (ST9), the acceleration voltage is preferably restored to a normal operation state.

As described above, in embodiments A through C, the excitation light L between the light source 2 and the photocathode 3 is controlled, and in embodiment D, the electron beam BN emitted from the photocathode 3 is controlled. Even in cases where a conventional thermionic-emission electron gun is used, it is possible to change the irradiation region of the electron beam BN by adjusting the acceleration voltage. However, in cases where steps similar to the first and second excitation light irradiation position adjustment steps (ST3, ST8) are implemented using a conventional thermionic-emission electron gun, it is necessary to adjust the position of the electron gun, or to provide two or more alignment devices 6 and cause the center line BC of the electron beam and the incident axis OA of the electron optical system to coincide. By contrast, in embodiments A through D, it is possible to make adjustments by only changing the irradiation position of the excitation light L in the first and second excitation light irradiation position adjustment steps (ST3, ST8). Specifically, it is not necessary to change the position of the electron gun 1, which is equipped with a photocathode, and it is possible to implement alignment even using one alignment device 6 (as shall be apparent, two or more alignment devices 6 may be used as necessary). The configuration characteristic of an electron gun equipped with a photocathode makes it possible to carry out alignment more readily than with conventional electron guns.

Embodiments A through D are described above, but the embodiments may be combined as necessary. For example, the excitation light L may be scanned as described in embodiment C while the irradiation region of the excitation light L is expanded using the excitation light irradiation region adjustment device 21 of embodiment A. Alternatively, embodiment D may be added to embodiments A through C.

A program for implementing the first embodiment (embodiments A through D) of the incident axis alignment method described above may be installed in a memory of a control device that controls the constituent elements of the electron gun 1, or may be provided as a computer program. Installing the program in the memory of the control device allows the control device to function as the incident axis information processing device 7. In cases where the program is provided as a computer program, incident axis alignment for a known electron gun equipped with a photocathode can be automated.

(Second Embodiment of Incident Axis Alignment Method)

Figure 14:
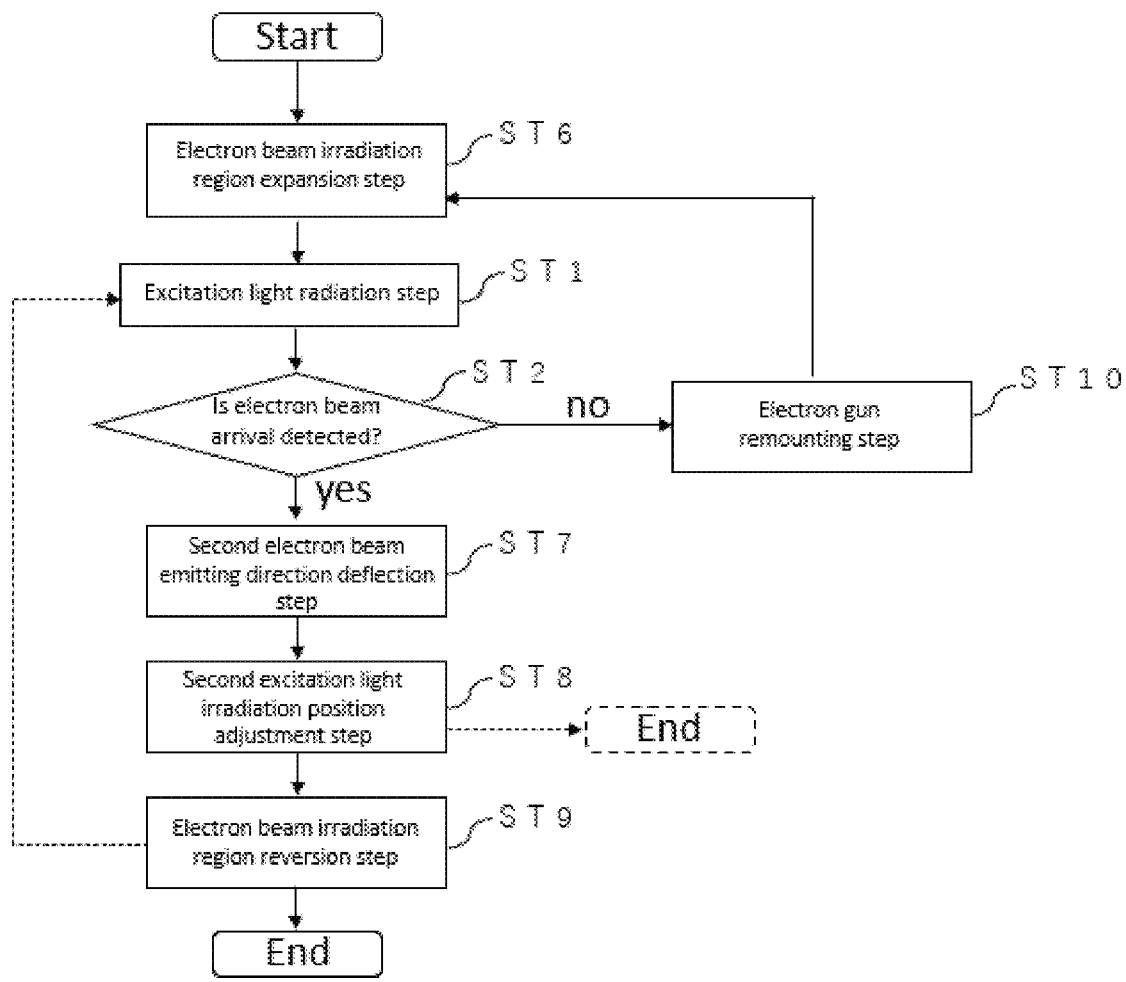
FIG. 14 is a flow chart showing one example of a second embodiment of an incident axis alignment method.

An overview of a second embodiment of an incident axis alignment method for an electron gun is described with reference to FIG. 14. FIG. 14 is a flow chart showing one example of the second embodiment of the incident axis alignment method. In the first embodiment of the incident axis alignment method, the electron beam irradiation region expansion step (ST6) is implemented only in cases where the electron beam BN in the first state was first radiated and then arrival of the electron beam BN could not be detected in the electron beam arrival detection step (ST2). Therefore, in cases where the electron gun 1 can be mounted at a substantially expected position due to an experienced operator mounting the electron gun 1 to the counterpart device E, an effect is exhibited in that alignment can be promptly implemented.

However, the second embodiment of the incident axis alignment method differs from the first embodiment of the incident axis alignment method for an electron gun in that the electron beam irradiation region expansion step (ST6) is implemented first. In the second embodiment of the incident axis alignment method, the electron beam irradiation region expansion step (ST6) is implemented first even when the electron gun 1 is mounted by an inexperienced operator, and therefore an effect is exhibited in that arrival of the electron beam BW can easily be detected by the detector 9.

In the second embodiment of the incident axis alignment method, the electron beam irradiation region expansion step (ST6) is implemented first, and then the excitation light radiation step (ST1) and the electron beam arrival detection step (ST2) are implemented in sequence, as shown in FIG. 14. As described above, because the electron beam irradiation region expansion step (ST6) is implemented first, there is a considerably high possibility that arrival of the electron beam BW will be detected in the electron beam arrival detection step (ST2), but in cases where arrival of the electron beam BW cannot be detected (the assessment "no" is made in ST2), an electron gun remounting step (ST10) is carried out, and then the process returns to the electron beam irradiation region expansion step (ST6).

However, in cases where the assessment "yes" is made in the electron beam arrival detection step (ST2), the process advances to the second electron beam emitting direction deflection step (ST7), the second excitation light irradiation position adjustment step (ST8), and the electron beam irradiation region reversion step (ST9), in the same manner as in the first embodiment of the incident axis alignment method. After the electron beam irradiation region reversion step (ST9) has been implemented, the process may end.

In the second embodiment of the incident axis alignment method, the specific procedures in the electron beam irradiation region expansion step (ST6), the excitation light radiation step (ST1), the electron beam arrival detection step (ST2), the second electron beam emitting direction deflection step (ST7), the second excitation light irradiation position adjustment step (ST8), and the electron beam irradiation region reversion step (ST9) may be the same as in the first embodiment of the incident axis alignment method.

In the second embodiment of the incident axis alignment method, steps may be added or modified, provided that the resulting method is within a range in which incident axis alignment can be implemented. For example, as indicated by the dotted lines in FIG. 14, after the electron beam irradiation region reversion step (ST9) has been implemented, the excitation light radiation step (ST1), the electron beam arrival detection step (ST2), the second electron beam emitting direction deflection step (ST7), and the second excitation light irradiation position adjustment step (ST8) may be implemented to thereby carry out realignment using the reverted electron beam BN, and after alignment precision has been improved or alignment has been confirmed, the process may end. The second electron beam emitting direction deflection step (ST7) may not be included, i.e., may be an optional step. The second electron beam emitting direction deflection step (ST7) also may be carried out after the second excitation light irradiation position adjustment step (ST8).

Examples of counterpart devices E equipped with electron guns include publicly known devices equipped with electron guns. Specific examples include electron microscopes, electron-beam holography devices, electron-beam drawing devices, electron-beam diffraction devices, electron-beam inspection devices, electron-beam metal additive manufacturing devices, electron-beam lithography devices, electron-beam processing devices, electron-beam curing devices, electron-beam sterilization devices, electron-beam disinfection devices, plasma generation devices, atomic element generation devices, spin-polarization electron-beam generation devices, cathode luminescence devices, and inverse photoemission spectroscopy devices.

INDUSTRIAL APPLICABILITY

When the incident axis alignment method for an electron gun equipped with a photocathode, the computer program, and the electron gun equipped with a photocathode disclosed in the present specification are used, it is possible to automate the incident axis alignment for the electron gun equipped with the photocathode. Therefore, the present invention is useful for makers who manufacture devices equipped with electron guns, and also for makers who use such devices or incident axis alignment methods.

REFERENCE SIGNS LIST

1: electron gun
2: light source
2a: light source unit
3: photocathode
5: photocathode-accommodating vessel
5h: electron beam passage hole
5m: treatment material
6: alignment device
7: incident axis information processing device
8: power source
9: detector
21: excitation light irradiation region adjustment device
22: excitation light radiation direction control device
22a: light source unit turning device
22b: excitation light scanning device
71: memory
BN: electron beam in first state
BC: center line of electron beam
BW: expanded electron beam
CB: vacuum chamber
D1, D2: aperture
E: counterpart device
L: excitation light
OA: incident axis of electron optical system

The invention claimed is:

1. An incident axis alignment method for an electron gun equipped with a photocathode,
the electron gun being capable of emitting an electron beam in a first state due to the photocathode being irradiated with excitation light, and
the method comprising at least
an excitation light radiation step,
a first excitation light irradiation position adjustment step for changing the irradiation position of the excitation light on the photocathode and adjusting the irradiation position of the excitation light, and an electron beam center detection step for detecting whether a center line of the electron beam in the first state coincides with an incident axis of an electron optical system, wherein in the first excitation light irradiation position adjustment step, a center of an irradiation region of the excitation light is determined based on the intensity of electrons detected by a detector being constant over the irradiation region while changing the irradiation position of the excitation light on the photocathode, and, in the electron beam center detection step, the excitation light is radiated at the position of the center of the irradiation region of the excitation light determined in the first excitation light irradiation position adjustment step.

2. The incident axis alignment method according to claim 1, wherein:

the method furthermore comprises a first electron beam emitting direction deflection step for deflecting the emitting direction of the electron beam in the first state at a position set apart from the photocathode; and the first electron beam emitting direction deflection step advances in cases where it is assessed, in the electron beam center detection step, that the center line of the electron beam in the first state does not coincide with the incident axis of the electron optical system.

3. The incident axis alignment method according to claim 1, wherein:

the method furthermore comprises an electron beam arrival detection step for detecting whether the electron beam, having passed through an aperture of the electron optical system, has arrived at a detector, an electron beam irradiation region expansion step for expanding an irradiation region irradiated with the electron beam emitted due to the photocathode being irradiated with the excitation light to a greater extent than an irradiation region of the electron beam in the first state, a second excitation light irradiation position adjustment step for changing the irradiation position of the excitation light and adjusting the irradiation position of the excitation light, and an electron beam irradiation region reversion step for restoring the electron beam that has been expanded through the electron beam irradiation region expansion step to the first state;

the electron beam arrival detection step is provided immediately after the excitation light radiation step;

in cases where arrival of the electron beam is detected in the electron beam arrival detection step, a process advances to the first excitation light irradiation position adjustment step;

in cases where arrival of the electron beam has not been detected in the electron beam arrival detection step, the process advances to the electron beam irradiation region expansion step; and the second excitation light irradiation position adjustment step is provided between the electron beam irradiation region expansion step and the electron beam irradiation region reversion step.

4. The incident axis alignment method according to claim 3, wherein, immediately before or immediately after the second excitation light irradiation position adjustment step, the method comprises a second electron beam emitting direction deflection step for deflecting the emitting direction of the electron beam expanded through the electron beam irradiation region expansion step at a position set apart from the photocathode.

5. The incident axis alignment method according to claim 3, wherein the electron beam irradiation region expansion step and the electron beam irradiation region reversion step are carried out by changing the irradiation region of the excitation light using an excitation light irradiation region adjustment device.

6. The incident axis alignment method according to claim 3, wherein the electron beam irradiation region expansion step is carried out by continuously changing the irradiation position of the excitation light using an excitation light radiation direction control device, and the electron beam irradiation region reversion step is carried out by not changing the irradiation position of the excitation light using the excitation light radiation direction control device.

7. The incident axis alignment method according to claim 3, wherein the electron beam irradiation region expansion step and the electron beam irradiation region reversion step are carried out by changing an acceleration voltage applied to the emitted electron beam.

8. The incident axis alignment method according to claim 1, wherein the first excitation light irradiation position adjustment step is carried out using an excitation light radiation direction control device.

9. The incident axis alignment method according to claim 3, wherein the second excitation light irradiation position adjustment step is carried out using an excitation light radiation direction control device.

10. The incident axis alignment method according to claim 3, wherein, after the electron beam irradiation region reversion step, the process advances to the electron beam arrival detection step.

11. A computer program that causes a computer including a processor and a memory under the control of the processor to execute the steps described in claim 1.

12. An electron gun equipped with a photocathode, the electron gun being provided with at least a computer including a processor and a memory under the control of the processor, and the memory having stored therein a computer program for causing the computer to execute the steps described in claim 1.

13. The incident axis alignment method according to claim 2, wherein:

the method furthermore comprises an electron beam arrival detection step for detecting whether the electron beam, having passed through an aperture of the electron optical system, has arrived at a detector, an electron beam irradiation region expansion step for expanding an irradiation region irradiated with the electron beam emitted due to the photocathode being irradiated with the excitation light to a greater extent than an irradiation region of the electron beam in the first state, a second excitation light irradiation position adjustment step for changing the irradiation position of the excitation light and adjusting the irradiation position of the excitation light, and an electron beam irradiation region reversion step for restoring the electron beam that has been expanded through the electron beam irradiation region expansion step to the first state;

the electron beam arrival detection step is provided immediately after the excitation light radiation step;

in cases where arrival of the electron beam is detected in the electron beam arrival detection step, a process advances to the first excitation light irradiation position adjustment step;

in cases where arrival of the electron beam has not been detected in the electron beam arrival detection step, the process advances to the electron beam irradiation region expansion step; and the second excitation light irradiation position adjustment step is provided between the electron beam irradiation region expansion step and the electron beam irradiation region reversion step.

14. The incident axis alignment method according to claim 13, wherein, immediately before or immediately after the second excitation light irradiation position adjustment step, the method comprises a second electron beam emitting direction deflection step for deflecting the emitting direction of the electron beam expanded through the electron beam irradiation region expansion step at a position set apart from the photocathode.

15. The incident axis alignment method according to claim 4, wherein the electron beam irradiation region expansion step and the electron beam irradiation region reversion step are carried out by changing the irradiation region of the excitation light using an excitation light irradiation region adjustment device.

16. The incident axis alignment method according to claim 13, wherein the electron beam irradiation region expansion step and the electron beam irradiation region reversion step are carried out by changing the irradiation region of the excitation light using an excitation light irradiation region adjustment device.

17. The incident axis alignment method according to claim 14, wherein the electron beam irradiation region expansion step and the electron beam irradiation region reversion step are carried out by changing the irradiation region of the excitation light using an excitation light irradiation region adjustment device.

18. The incident axis alignment method according to claim 4, wherein the electron beam irradiation region expansion step is carried out by continuously changing the irradiation position of the excitation light using an excitation light radiation direction control device, and the electron beam irradiation region reversion step is carried out by not changing the irradiation position of the excitation light using the excitation light radiation direction control device.

19. The incident axis alignment method according to claim 13, wherein the electron beam irradiation region expansion step is carried out by continuously changing the irradiation position of the excitation light using an excitation light radiation direction control device, and the electron beam irradiation region reversion step is carried out by not changing the irradiation position of the excitation light using the excitation light radiation direction control device.

20. The incident axis alignment method according to claim 13, wherein the electron beam irradiation region expansion step and the electron beam irradiation region reversion step are carried out by changing an acceleration voltage applied to the emitted electron beam.

* * * * *